United States Patent [19]

Gabany

[11] Patent Number: 4,964,805

[45] Date of Patent: Oct. 23, 1990

[54] MICROCOXIAL CONNECTOR HAVING BIPARTITE OUTER SHELL

[75] Inventor: Andrew J. Gabany, Mechanicsburg, Pa.

[73] Assignee: AMP Incorporated, Harrisburg, Pa.

[21] Appl. No.: 460,437

[22] Filed: Jan. 3, 1990

[51] Int. Cl.[5] ............ H05K 1/00

[52] U.S. Cl. ............ 439/63; 439/581; 439/434

[58] Field of Search ............ 439/433, 434, 578–585, 439/675, 63

[56] References Cited

U.S. PATENT DOCUMENTS

| | | | |
|---|---|---|---|
| 3,012,307 | 12/1961 | Felts | 439/63 |
| 4,412,717 | 11/1983 | Monroe | 439/581 |
| 4,598,961 | 7/1986 | Cohen | 439/63 |
| 4,619,496 | 10/1986 | Forney, Jr. et al. | 439/434 |
| 4,684,200 | 8/1987 | Capp | 439/63 |
| 4,687,446 | 8/1987 | Birch et al. | 439/581 |
| 4,718,854 | 1/1988 | Capp et al. | 439/63 |
| 4,795,352 | 2/1988 | Randolph et al. | 439/63 |
| 4,799,900 | 4/1988 | Randolph et al. | 439/585 |
| 4,861,271 | 8/1989 | Bogar et al. | 439/63 |

OTHER PUBLICATIONS

"LAN Coaxial Braid Filter Connectors," National Tel–tronics Company, pp. 1–4.

"Microwave and RF Coaxial Connectors", Radiall Company, p. VII.

*Primary Examiner*—David L. Pirlot

[57] ABSTRACT

A coaxial electrical connector for printed circuit boards comprises an electrically conductive outer body (2) and (5) adapted to rest upon the surface of a printed circuit board, and having electrically conductive ground legs (14, 15, 16, and 17) supported by the body, the ground legs being a plurality of downwardly extending legs adapted to extend through apertures in the printed circuit board, to be electrically connected to conductive paths on the board; a center contact extending from within the body and having a first contact portion (33) which is adapted to extend through an aperture in the printed circuit board to be electrically connected to the conductive path on the board, and a second contact portion (32) which is adapted to mate with the center contact of a complimentary coaxial connector; and a dielectric insulating body (4) substantially surrounding the second contact portion (32). The electrically conductive outer body is a bipartite body having a lower base (6), substantially surrounding the first contact portion (33), and of a material composition suitable for solder connection to a printed circuit board; and an upper electrically conductive outer shell (5), substantially surrounding the second contact portion (32), and of a material suitable for providing an electrical plating interface surface, and further, the upper shell (5) having an end captivated by press fit within a complimentary end of the lower base (6).

7 Claims, 3 Drawing Sheets

MICROCOXIAL CONNECTOR HAVING BIPARTITE OUTER SHELL

FIELD OF THE INVENTION

The present invention relates to electrical connectors and more particularly to microcoaxial connectors to be mounted on printed circuit boards. This invention encompasses microcoaxial connectors manufactured with linear and right angle configurations. The invention also relates to a method of assembling such connectors.

BACKGROUND OF THE INVENTION

Microcoaxial connectors to be mounted on printed circuit boards include a dielectric base adapted to rest upon the surface of a printed circuit board, (PCB) an electrically conductive ground leg supported by the base with the ground leg having a plurality of downwardly extending legs which are adapted to extend through apertures in the printed circuit board to be electrically connected to conductive paths on the board, a center contact having a first contact portion which is adapted to extend through an aperture in the circuit board to be electrically connected to a conductive path on the board and a second contact portion which is adapted to mate with the contact of a complimentary coaxial connector; a dielectric insulating member substantially surrounding the second contact portion; and an electrically conductive outer shell substantially surrounding the second contact portion for providing shielding for the connector. A representative coaxial connector is disclosed by Capp et al., U.S. Pat. No. 4,795,352.

In making connection, the electrically conductive ground legs and center contact are inserted through apertures in a printed circuit board to electrically connect with respective electrically conductive paths with the lower base of the outer shell abutting the surface of the circuit board and then soldered thereto by conventional soldering techniques. Upper contact portion mates with the center of a complimentary microcoaxial cable with the upper portion of the outer shell providing a snap-in connection with the cable. The upper portion must be of a material that will provide a plating surface for adequate electrically interface with the conductive jacket of the coaxial cable.

SUMMARY OF THE INVENTION

An objective of this invention is to provide a coaxial electrical connector having a bipartite conductive outer shell. A bipartite outer shell permits a lower part having a plating, such as tin-lead, that will provide a surface for soldering to a circuit board, and permits an upper part having a plating, such as gold, that will provide an electrical interface surface for contact with a coaxial cable.

Another objective is to provide a joinder between the two parts of the bipartite shell that results in a two part body having a structural integrity substantially equivalent to that of a shell of unitary construction. Another objective is to provide a method for economically manufacturing a coaxial electrical connector.

The invention relates to a coaxial electrical connector for printed circuit boards comprising: an electrically conductive outer body adapted to rest upon the surface of a printed circuit board, and having electrically conductive ground legs supported by the body, the ground legs being a plurality of downwardly extending legs adapted to extend through apertures in the printed circuit board, to be electrically connected to conductive paths on the board; a center contact extending from within the body and having a first contact portion which is adapted to extend through an aperture in the printed circuit board, to be electrically connected to a conductive path on the board, and a second contact portion which is adapted to mate with the center contact of a complimentary coaxial connector; and a dielectric insulating body substantially surrounding the second contact portion.

The improvement of the present invention is an electrically conductive outer body being a bipartite body having a lower base substantially surrounding the first contact portion, and of a material composition suitable for solder connection to a printed circuit board, and an upper electrically conductive outer shell, substantially surrounding the second contact portion, and of a material suitable for providing an electrical plating interface surface, and, further, the upper shell having an end captivated by press fit within a complimentary end of the lower base.

In an embodiment of the present invention the lower base has an upper collar portion and an inner annular shoulder and the upper shell has an extended outward annular flange. The extended outward annular flange is captivated by press fit between the upper collar portion and the inner annular shoulder of the base.

The present invention also relates to a method for assembling a coaxial electrical connector from component parts including a center contact, a dielectric body, a conductive outer shell with extended outward annular flange, and a base with inner annular shoulder. The method comprises the steps of: concentrically encircling the center contact with the dielectric body; concentrically encircling the dielectric body and contact with the electrically conductive outer shell with extended outward annular flange; and assembling the dielectric body, contact and outer shell to the base with inner annular shoulder by captivating the extended outward annular flange of the shell by press fit within the annular shoulder of the base.

In another aspect of the invention, the base has an upper collar portion with its upper end beveled at its outer annular edge and at its inner edge, and the annular flange of the shell has a leading end beveled at both edges and the flange has a shoulder with beveled edge. With this aspect, the assembling steps comprise inserting the dielectric body, contact and outer shell along the inner beveled end of the upper collar portion to seat the annular leading edge of the flange of the shell against the annular shoulder of the base and with the annular flange of the shoulder seating against the inner wall of the upper collar portion; concentrically encircling the dielectric body contact and outer shell and the upper collar portion of the base with a forming tool; and constrictively applying the forming tool to the upper collar portion of the base along the bevel at its outer annular edge, to bend, radially inwardly and along the bevel of the shoulder, the upper end of the collar portion to provide an inward flare over the shoulder of the annular flange, whereby the annular flange is captivated by press fit within the inward flared upper end of the collar portion and the inner annular shoulder, and the base and shell are formed into a discrete unitary body. Further advantages and important features of the present invention will be set forth hereinafter in conjunction with the following detailed description.

DESCRIPTION OF THE DRAWINGS

FIGS. 1, 2, 3 and 4 illustrate a coaxial electrical connector of the quick disconnect type. The connector is generally designated by reference numeral 1 and is designed to be mounted to a printed circuit board to provide a coaxial electrical connection to conductive paths on the board as is well known to those skilled in the art.

Figure 1:
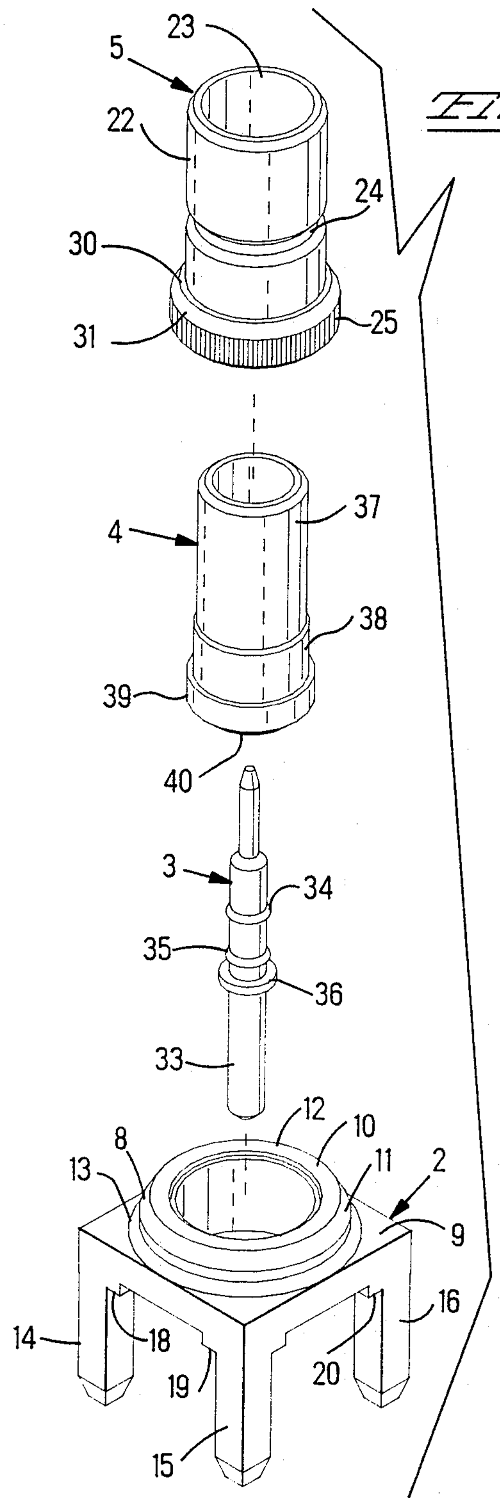
FIG. 1 is an exploded perspective view of a microcoaxial connector having bipartite outer shell.

Connector 1 comprises a jack connector and is composed of an assembly of component parts which includes a conductive base 2, a conductive center contact 3, a dielectric body or insulating member 4, and an; electrically conductive outer shell 5.

Conductive base 2 of tin-lead plated zinc has a stepped bore 6 with an annular shoulder 7 and includes an upper collar portion 8 and a square platform 9. Upper collar portion 8 has an upper end 10 inwardly flared and beveled at an outer annular edge 11 and at an inner annular edge 12 to accommodate a forming tool during assembly of connector 1, as hereinafter described. Upper collar portion 8 has a flared outward surface 13 to the square platform 9 with a plurality of integral posts 14, 15, 16, and 17 (not shown) for pluggable receipt into PCB housing apertures. Foot portions 18, 19, 20, and 21 (not shown) are adapted to rest on the surface of the housing of the PCB when the connector 1 is mounted to the board and function as stand off pads to isolate the rest of the base 2 from the PCB.

Electrically conductive outer shell 5 has a cylinder-shaped body 22 of brass or other suitable material and includes a core 23 and an exterior waist 24 and at its lower end, an annular flange 25 forming enlarged bore section 26. Annular flange 25 is shown with straight knurling for improved fit within the collar portion 8 of the base 2, and has a leading end 27 which is beveled at both edges 28 and 29 and shoulder 30 with a beveled edge 31. Within core 23 of outer shell 5, annular flange 25 forms shoulder 30 with a beveled edge 31.

Center contact 3 comprises a male pin contact portion 32, which is adapted to mate with the female contact portion of a complimentary coaxial connector, and depending elongated terminal pin portion 33 which is adapted to extend through an aperture in a printed circuit board. Center contact 3 is further characterized by encircling barbs 34 and 35 and flange 36.

Figure 2:
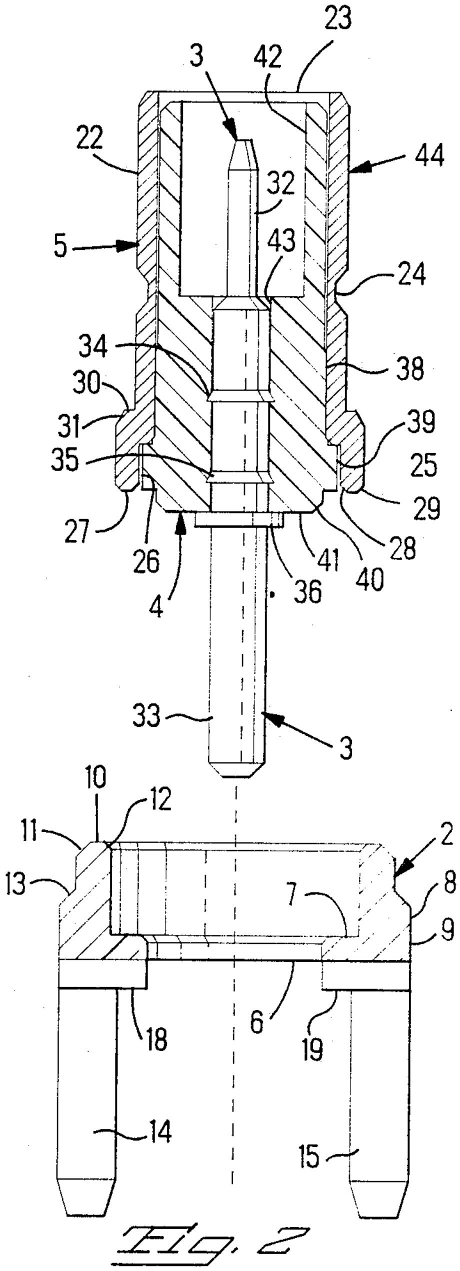
FIG. 2 is a front section view showing parts prior to forming the connector of the invention.
Figure 3:
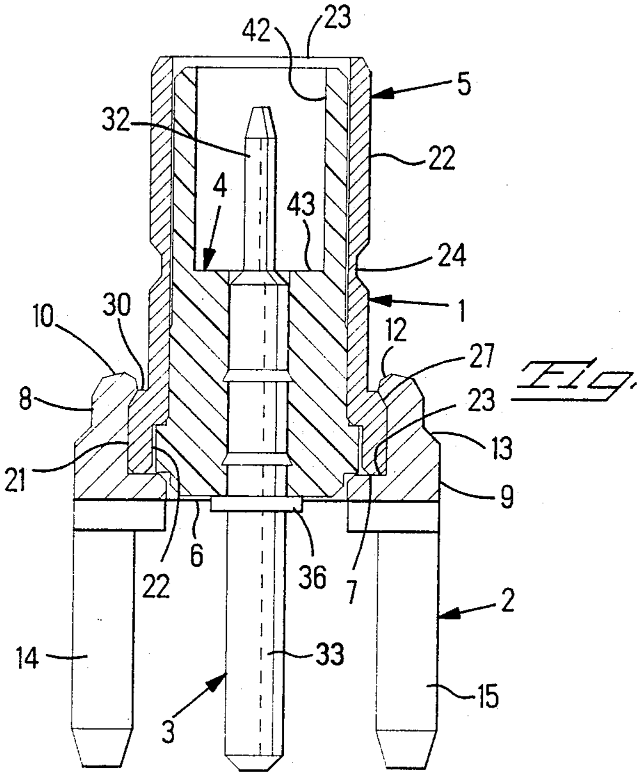
FIG. 3 is a front section view of the connector as constructed and FIG. 4 is a perspective view of the connector as constructed.
Figure 4:
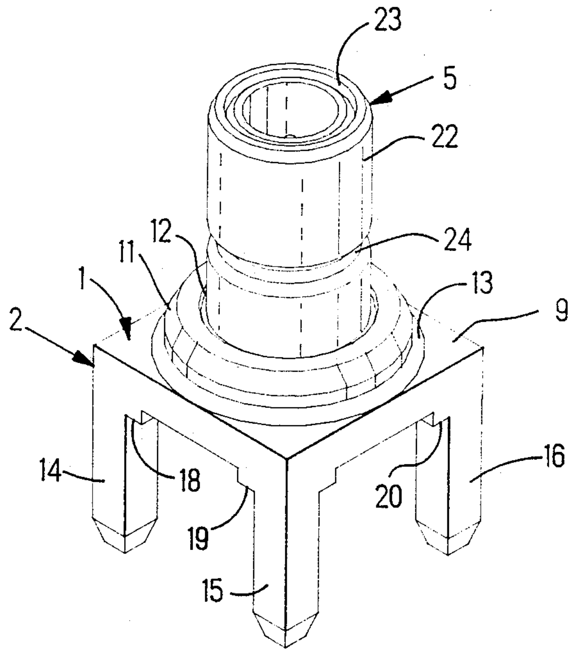

Dielectric insulating body or member 4 comprises a generally cylinder or tubular shaped portion 37 of polyphenylene sulfide, polyfluorocarbons such as polytetrafluoroethylene or the like and having an outer stepped profile defined by lower portion 38 of enlarged diameter, outwardly radially extending annular flange 39, and lower end portion 40 with an end 41. As shown in FIGS. 1, 2, and 3, flange 39 is sized to fit within enlarged diameter bore section 26 of base 2 when the connector is assembled as hereinafter described. Dielectric insulating member 4 also has axial bore of large diameter section 42 to provide a receptacle for receipt of a connector with female contact portion for connection to the male pin contact portion of center contact 32, and narrower diameter section 43 to encompass the elongated terminal pin portion 33 of the center contact 3.

With reference to FIGS. 1, 2, 3, and 4, to assemble the connector 1, conductive center contact 3 is inserted through bore 43 of the dielectric body 4 and secured therein by press fit of encircling barbs 34 and 35 against the wall of axial bore portion of narrower diameter 43, with flange 36 resting or seating to the end 41 of the dielectric body 4. Male contact portion 32 imposes into the axial bore of large diameter section 42 which forms a contact and receptacle for receipt of a connector with a female contact portion.

The combined dielectric body 4 and conductive center contact 3 is inserted into core 23 of the conductive outer shell 5 with the dielectric body constricted and secured by the fit of the lower profile portion of the body having enlarged diameter 38 against the wall of the core 23 of shell 5 with radially extending flange 39 within annular flange 25.

The resulting three part assembly 44 of outer shell 5, dielectric body 4, and center contact 3 is formed to base 2, in accord with the present invention, by inserting the assembly 44 along bevel 12 of upper end 10 of base 2, within upper collar portion 8 of base 2, with the annular leading edge 27 of flange 25 resting or seating against the annular shoulder 7 of stepped bore 6 of base 2, and further, with annular flange 25 seating against the inner wall of upper collar portion 8. A forming tool or punch tool, concentrically encircling the three part assembly and upper collar portion 8 of base 2, is constrictively applied along the outer bevel 11 of upper end 10 to deform or bend radially inwardly and along bevel 31 of shoulder 30 of the upper end 10, to provide an inward flare, rolled-over the shoulder 30 of annular flange 27. Thereby, the outward annular flange 27 is captivated by the press fit within the inward flared upper end 10 of collar portion 8, and inner annular shoulder 7, whereby the base 2 and conductive outer shell 5 form a discrete unitary body. The unitary body may have a base 2 of tin-lead plated over a combination of copper plated zinc or tin/nickel plated over copper plated zinc die cast with brass shell 5 having gold over copper plating at all interface surfaces. The tin/nickel or tin/lead over copper/zinc plating of the base 2 provides a surface for soldering of the base to a mating surface of a PCB. Gold plating of the shell 5 provides an excellent, resistant-to-corrosion, interface with the shell of a compatible plug which connects to the male contact portion 32 of the conductive center contact 3. The shell 5 with base 2 functions as a one piece part but is economical in that it need not be a machined part.

Figure 5:
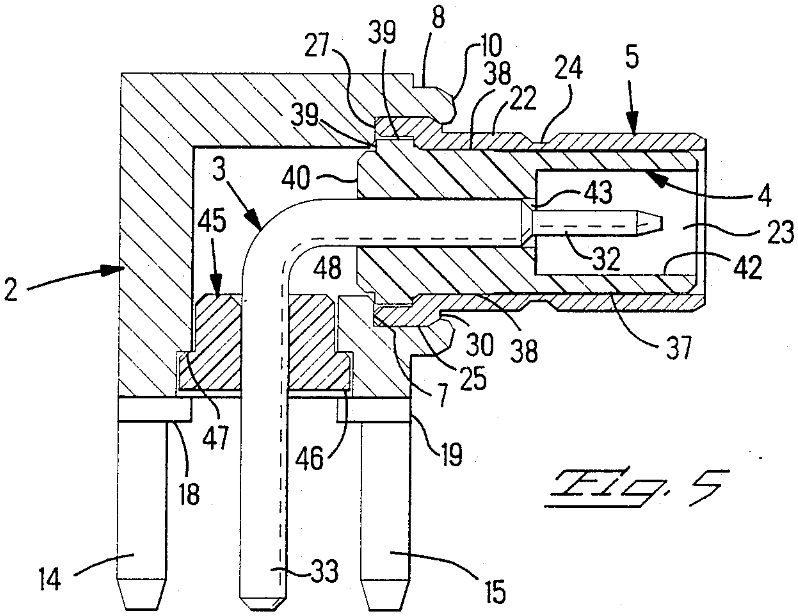
FIG. 5 is a front section view of a microcoaxial connector of the present invention with right angle configuration.
Figure 6:
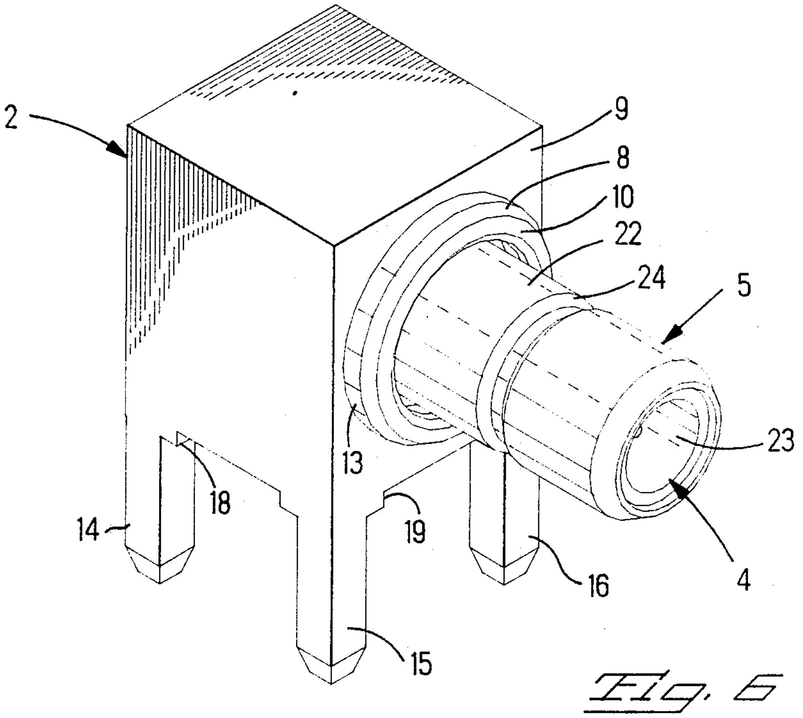
FIG. 6 is a perspective view of the microcoaxial connector of FIG. 5.

With reference to FIGS. 5 and 6, is shown another embodiment of the present invention wherein the coaxial electrical connector 1 is of a right angle configuration. Where elements are the same, numbering follows the convention of FIGS. 1, 2, 3, and 4.

Constrictive base 2 is a right-angle housing with side collar portion 8 and right-angle stepped bore 6. FIGS. 5 and 6 show the connector 1 as constructed with base 2 having platform 9 and collar portion 8 with upper end 10 inwardly flared to capture the shoulder 30 of flange 25 of conductive shell 5. Side collar portion 8 has flared outward surface 13 to platform 9 in the shape of a right-angle housing. Platform 9 has a plurality of integral parts 14, 15, 16, and 17 (not shown) for pluggable receipt into PCB housing apertures and foot portions 18, 19, 20, (not shown) and 21 (not shown) to rest on the surface of the PCB.

Shell 5 is a cylinder-shaped body 22 with core 23 and exterior waist 24, and with annular flange 25 having leading edge 27 that fits against annular shoulder 7 of base 2.

Again, the conductive base 2 may be of tin or nickel plated zinc and the shell of brass with gold plating at interface surfaces.

The right-angle connector 1 has two dielectric insulating bodies 4 and 45. Upper insulating body 4 is tubular in shape with outer step profile defined by a lower portion of enlarged diameter 38 and flange 39 and with end portion 40. Flange 39 fits within the bore portion 26 of base 2. Dielectric body 4 has axial bore of large diameter section 42 which forms a receptacle for a complimentary connector having female contact portion and narrower diameter section 43 which partially encompasses pin portion 33 of center contact 3.

Lower dielectric body 45 has radial flange 46 which is secured between pads 18, 19, 20, (not shown) and 21 (not shown) and annular shoulder 47 of the right-angle base 2. Body 45 has bore 48 partially encompassing the depending pin portion 33 of contact 3. Pin portion 33 extends through bore 48 to extend beyond the body for connection through an aperture in a PCB.

The coaxial electrical connector of the present invention may take numerous other forms. For example, the connector family of the invention may include connectors designed to be bulkhead mounted. Because the invention can take numerous other forms, it should be understood that the invention should be limited only insofar as is required by the scope of the following claims:

I claim:

1. A coaxial electrical connector for printed circuit boards comprising:

an electrically conductive outer body adapted to rest upon the surface of a printed circuit board, and having electrically conductive ground legs supported by the body, the ground legs being a plurality of downwardly extending legs adapted to extend through apertures in the printed circuit board, to be electrically connected to conductive paths on the board; a center contact extending from within the body and having a first contact portion which is adapted to extend through an aperture in the printed circuit board to be electrically connected to a conductive path on the board, and a second contact portion which is adapted to mate with the center contact of a complementary coaxial connector; and a dielectric insulating body substantially surrounding said second contact portion;

wherein, the electrically conductive outer body is a bipartite body having a lower base substantially surrounding the first contact portion, and with an upper portion and an inner annular shoulder and an annular leading edge; and an upper electrically conductive outer shell, substantially surrounding the second contact portion, and with an extended outward annular flange captivated by press fit within the upper collar portion and the inner annular shoulder of the lower base; said annular leading edge of the lower base inwardly flared to captivate the flange of the shell between the said annular leading edge and the inner annular shoulder of the base.

2. The coaxial electrical connector of claim 1 wherein the dielectric insulating body has an outward annular flange and the upper shell of the bipartite body has an extending outward annular flange forming a step profile within a portion of the annular bore of the said upper shell, the extending outward annular flange of the insulating body captivated by press fit within the step profile of the extending outward annular flange of the shell and the inner annular shoulder of the lower base.

3. The coaxial electrical connector of claim 1 wherein the base is a right-angle housing.

4. The coaxial electrical connector of claim 3 wherein the upper collar has an upper end beveled at its outer annular edge and at its inner edge, and the annular flange of the shell forms an enlarged bore section within said shell with the annular flange having a leading end beveled at both edges, and the flange having a shoulder with a beveled edge.

5. A method for assembling a coaxial electrical connector from component parts including a center contact, a dielectric body, a conductive outer shell with an extended outward annular flange having leading end beveled at both edges and having a shoulder with a beveled edge, and a base with an inner annular shoulder, and an upper collar portion with an upper end beveled at an outer annular edge and at an inner edge, the method comprising:

concentrically encircling the center contact with the dielectric body;

concentrically encircling the dielectric body and contact with the electrically conductive outer shell with said extended outward annular flange; and inserting the dielectric body, contact and outer shell along the inner beveled end of the upper collar portion to seat the annular leading edge of the flange of the shell against the annular shoulder of the base and with said annular flange of the shoulder seating against the inner wall of the upper collar portion;

concentrically encircling the dielectric body, contact and outer shell and the upper collar portion of the base with a forming tool; and constrictively applying the forming tool to the upper collar portion of the base, along the bevel at its outer annular edge, to bend, radially inwardly and along the bevel of the shoulder, the upper end of the collar portion to provide an inward flare over the shoulder of the annular flange whereby the annular flange is captivated by press fit within the inward flared upper end of the collar portion and the inner annular shoulder, and the base and shell are formed into a discrete, unitary body.

6. The method of claim 5 wherein the dielectric insulating body has an outward annular flange and the extended outward annular flange of the shell forms a step profile within a portion of the annular bore of the shell, and wherein the combined dielectric body, contact and outer shell is assembled to the base by captivating the flange by press fit within the step profile of the shell and the inner annular shoulder of the base.

7. The coaxial electrical connector of claim 3 wherein the lower base includes an upper collar portion set on a square platform, with a plurality of integral posts for pluggable receipt into a printed circuit board, and with foot portions adapted to rest on the surface of the housing of the board when the connector is mounted to the board, the foot portions functioning as stand-off pads to isolate the rest of the base from the board.

* * * * *